United States Patent [19]

Adelman et al.

[11] Patent Number: 5,572,779
[45] Date of Patent: Nov. 12, 1996

[54] METHOD OF MAKING AN ELECTRONIC THICK FILM COMPONENT MULTIPLE TERMINAL

[75] Inventors: Jeffrey T. Adelman; Thomas L. Veik; Scott D. Zwick, all of Columbus, Nebr.

[73] Assignee: Dale Electronics, Inc., Columbus, Nebr.

[21] Appl. No.: 336,538

[22] Filed: Nov. 9, 1994

[51] Int. Cl.$^6$ .................................................. H01G 7/00
[52] U.S. Cl. ............................ 29/25.42; 29/412; 29/600; 29/874; 29/885
[58] Field of Search ....................... 29/412, 527.2, 29/527.4, 25.42, 854, 874, 885, 600; 333/184; 437/226

[56] References Cited

U.S. PATENT DOCUMENTS

| | | | |
|---|---|---|---|
| 3,192,086 | 6/1965 | Gyurk. | |
| 3,328,865 | 7/1967 | Sperry | 29/25.42 |
| 3,798,059 | 3/1974 | Astle et al. | 117/212 |
| 3,812,442 | 5/1974 | Muckelroy | 336/83 |
| 4,322,698 | 3/1982 | Takahashi et al. | 333/184 |
| 4,543,553 | 9/1985 | Mandai et al. | 336/200 |
| 4,689,594 | 8/1987 | Kawabata et al. | 336/200 |
| 4,731,297 | 3/1988 | Takaya | 428/553 |
| 4,746,557 | 5/1988 | Sakamoto et al. | 428/138 |
| 4,754,242 | 6/1988 | Okamura et al. | 333/175 |
| 4,852,227 | 8/1989 | Burks | 29/25.42 X |
| 4,930,216 | 6/1990 | Nelson | 29/854 |
| 4,959,631 | 9/1990 | Hasegawa et al. | 336/83 |
| 4,984,358 | 1/1991 | Nelson | 29/854 X |
| 4,999,597 | 3/1991 | Gaynor | 333/246 |
| 5,014,024 | 5/1991 | Shimizu et al. | 333/203 |
| 5,014,026 | 5/1991 | Wanjura | 333/185 |
| 5,015,972 | 5/1991 | Cygan et al. | 333/32 |
| 5,032,810 | 7/1991 | Kaneko et al. | 333/185 |
| 5,032,815 | 7/1991 | Kobayashi et al. | 336/83 |
| 5,034,709 | 7/1991 | Azumi et al. | 333/184 |
| 5,034,710 | 7/1991 | Kawaguchi | 333/185 |
| 5,034,717 | 7/1991 | Shinkai | 336/223 |
| 5,039,964 | 8/1991 | Ikeda | 333/181 |
| 5,045,380 | 9/1991 | Kobayashi et al. | 428/195 |
| 5,051,712 | 9/1991 | Naito et al. | 333/185 |
| 5,264,983 | 11/1993 | Petrinec | 29/25.42 X |

FOREIGN PATENT DOCUMENTS

| | | | |
|---|---|---|---|
| 96710 | 6/1983 | Japan | 336/200 |
| 102215 | 5/1988 | Japan | 336/200 |
| 2-135715 | 5/1990 | Japan | 336/200 |
| 4-111405 | 4/1992 | Japan | 336/200 |

*Primary Examiner*—S. Thomas Hughes
*Attorney, Agent, or Firm*—Zarley, McKee, Thomte, Voorhees & Sease

[57] ABSTRACT

A method of making a plurality of monolithic thick film components having multiple terminals comprising the steps of printing a plurality of components in a wafer form forming a matrix of components, printing holes in the matrix of components where two terminal ends meet thereby separating the terminals on each component, and dipping the terminal ends in a silver based thick film ink.

13 Claims, 3 Drawing Sheets

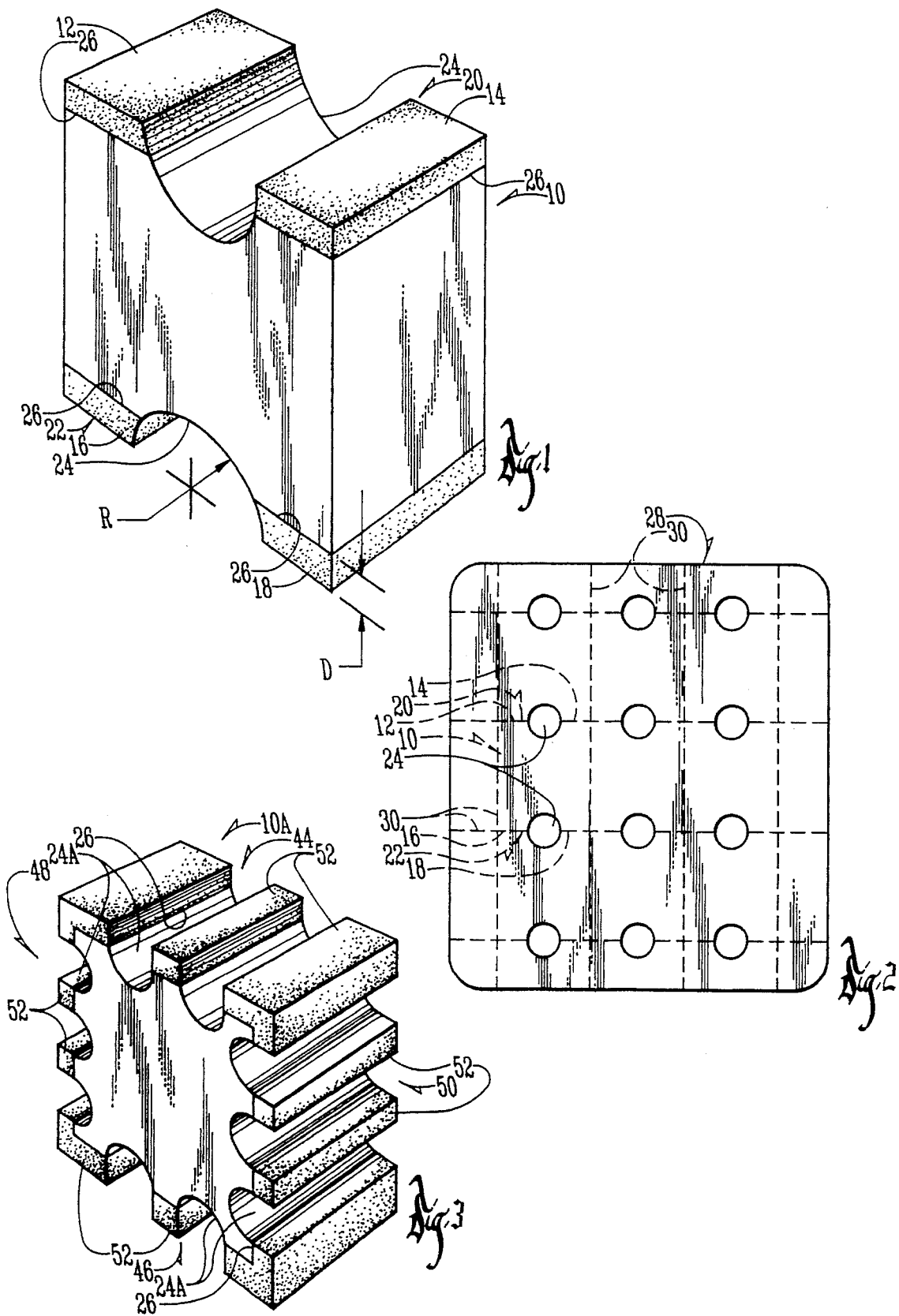

1

METHOD OF MAKING AN ELECTRONIC THICK FILM COMPONENT MULTIPLE TERMINAL

BACKGROUND OF THE INVENTION

The present invention relates to a method of creating multiple terminals on monolithic chip components including transformers, inductors, or any other electronic thick film component. Monolithic components exist in the prior art, but there is a need for such components having multiple terminals which can be easily manufactured in large quantities, and which provide an improved reliability in operation. Therefore, a primary object of the present invention is the provision of an improved monolithic chip component and method for making the same.

A further object of the present invention is a provision of an improved monolithic chip component having a plurality of terminals.

A further object of the present invention is the provision of an improved monolithic multi-terminal chip component which can be manufactured in large quantities on a single sheet of material, later to be cut apart into individual components.

A further object of the present invention is the provision of an improved monolithic multi-terminal chip component and method for making the same which is simple in construction, easy to manufacture, and efficient and reliable in operation.

SUMMARY

The present invention consists of a monolithic thick film component having a plurality of terminals on at least one side of the component. Other sides of the component may have no terminals or any of them may have one or more terminals. FIGS. 1, 3, 5, and 7 each show possible embodiments of the present invention. The Figures and descriptions are not intended to limit the scope of the present invention, on the contrary the present invention applies to all possible embodiments within the scope and spirit of the present invention.

The multi-terminal monolithic chip components of the present invention can be mass produced by printing a plurality of components in a wafer form. The components include at least one conductive element within the component that has an end extending at least to the edge of the component for connection with an external terminal means. Within each wafer, the individual parts are arranged adjacent to each other closely together forming a matrix of parts. Where the terminal end of one part meets the terminal end of an adjacent part, a hole in the thick film ink is printed. The wafer is then cut into the individual components. The hole is positioned such that it forms the separation between two terminals on both adjacent parts.

The terminal end of each component is then dipped into a silver based thick film ink to form a termination on the component. The silver ink makes electrical contact with the conductor or conductors at the terminal end of the component. The hole that separates the terminals of the component allows the terminals to make contact with the silver ink without the silver ink shorting the terminals together.

BRIEF DESCRIPTION OF THE DRAWINGS

FIG. 1 shows a component with two terminals on two opposing sides.

FIG. 2 shows a plurality of the parts of FIG. 1 in a wafer form.

FIG. 3 shows a component with three terminals on two opposing sides and four terminals on the other two opposing sides.

DETAILED DESCRIPTION OF THE PREFERRED EMBODIMENTS

Figure 4:
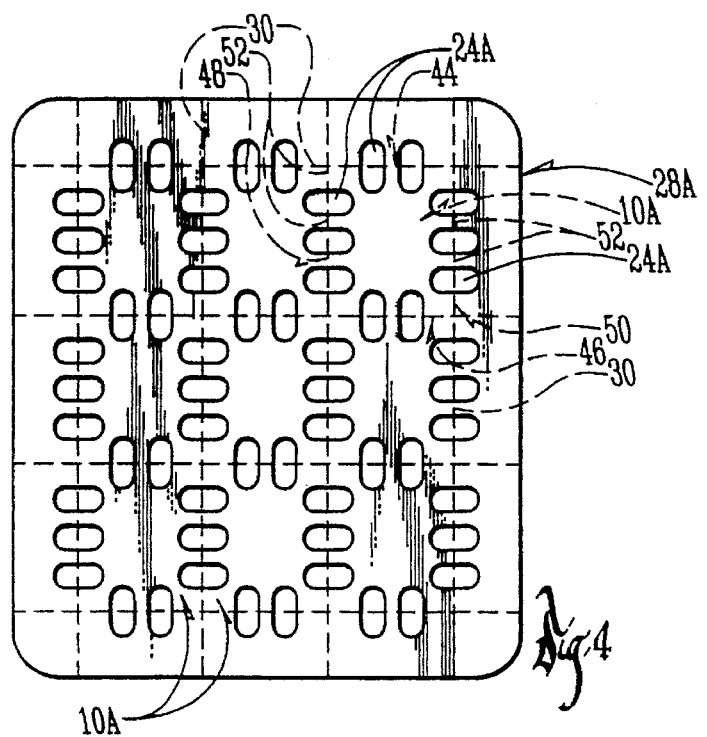
FIG. 4 shows a plurality of the parts of FIG. 3 in a wafer form.

The present invention will be described as it applies to several embodiments. It is not intended that the present invention be limited to the described embodiments. It is intended that the invention cover all alternatives, modifications, and equivalences which may be included within the spirit and scope of the invention.

As is well known in the art, the most common method for termination of monolithic chip components is dipping each end of the component in a silver based thick film ink or other type of termination material. The silver based thick film ink makes electrical contact with the desired conductive elements of the chip component. The component termination is accomplished by holding a plurality of chip components in place using some form of fixture. The fixture is then lowered into the silver based thick film ink until the chip components make contact with the silver ink. The components are removed and are allowed to dry, and then the process is repeated for any other terminal ends of the components. As a result of this process, the desired conductive elements within the monolithic chip components are electrically connected to the silver ink which is now on the outside of the component.

This process works very well when a component only has two terminals, each on opposing sides of the component. However, when a component has more than two terminals, there are problems with this process. If the component has terminations on more than two sides, it becomes very difficult to present each side of the part to the silver ink in a mass production situation without the silver ink shorting two terminals together. If the silver ink from one dipping makes contact with the silver ink of another dipping, the two terminals will be shorted together which will result in a faulty component. Also, if the component has more than one terminal on one side, a process must be found to keep the silver ink from electrically shorting the terminals together. The present invention addresses and solves these problems.

Using the method of the present invention, the parts can be mass produced by first printing a plurality of parts (FIGS. 1, 3, 5, and 7) in a wafer form (FIGS. 2, 4, 6, and 8). As shown in FIG. 2 for example, the individual parts 10 are arranged on the wafer 28 such that they are placed closely together forming a matrix of parts. Where the terminal end 22 of one part meets the terminal end 20 of the adjacent part, a hole 24 in the thick film ink is printed. The hole 24 is formed at a point between the terminals 16 and 18 of one component and 12 and 14 of the adjacent component. The radius R of hole 24 should be larger than the maximum depth D that the termination material will extend up the terminals. The wafer 28 is then cut apart forming a plurality of individual parts 10. These cuts 30 are shown as dotted lines in FIG. 2. As seen in FIG. 1, each terminal end 20 and 22 includes a portion of the hole 24 that was previously printed. This portion of the hole 24 forms the separation between the terminals 12 and 14 and the terminals 16 and 18 of the adjacent component.

As described above, the individual parts 10 are dipped into a silver based thick film ink 26. As long as the radius R of the hole 24 is larger than the maximum depth D of the silver ink 26 that extends up the terminals, the two terminals 12 and 14 on each side of the hole 24 will be electrically separated.

Figure 6:
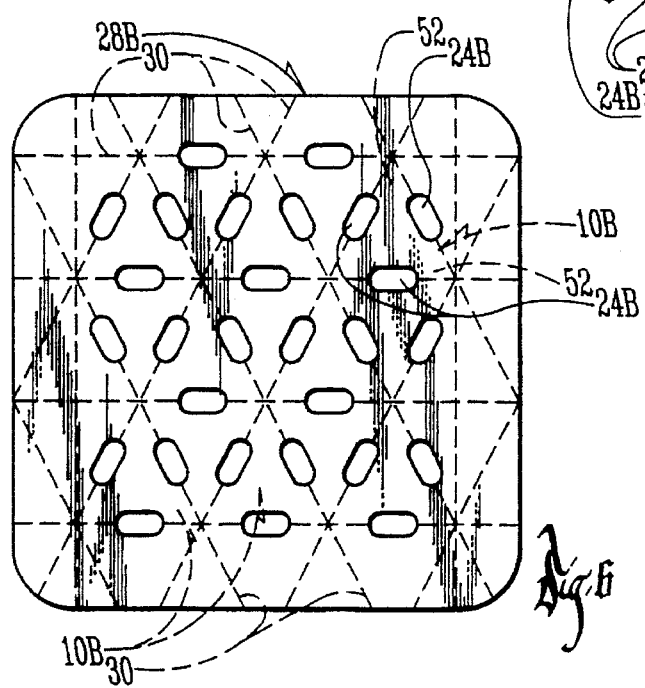
FIG. 6 shows a plurality of the parts of FIG. 5 in a wafer form.
Figure 8:
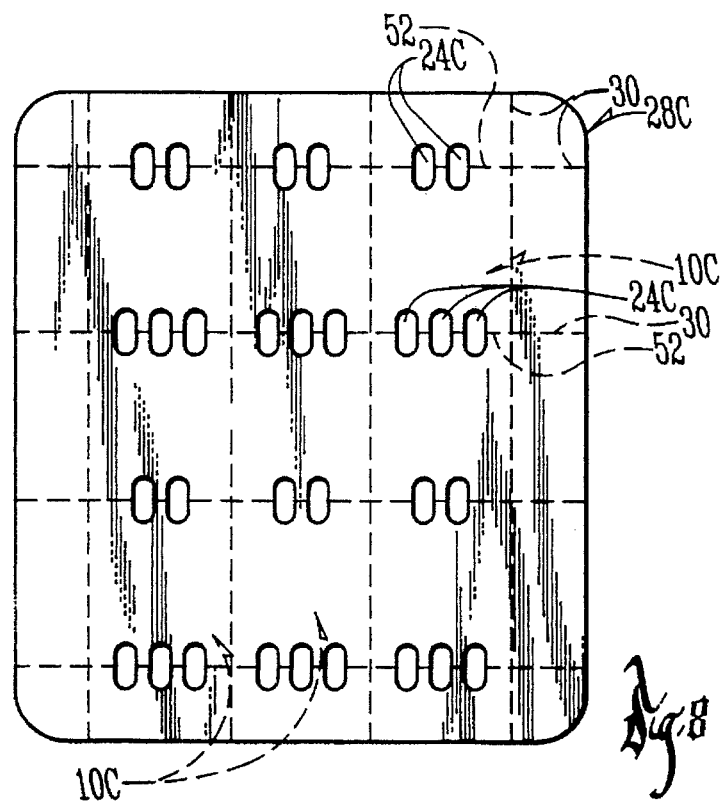
FIG. 8 shows a plurality of the parts of FIG. 7 in a wafer form.

The shape of the openings 24 printed in the thick film ink is by no means limited to a circle. Many other shapes could be used. For example, an oval, a square, or a rectangle could be used. FIGS. 4, 6, and 8, all show embodiments that utilize an oval opening 24A rather than a circular opening 24 as shown in FIG. 1. In the preferred embodiment an oval shaped opening is used. An oval shaped opening has the advantage of allowing a greater number of terminals to be formed on any one side of a component.

The number of openings printed per side of each component 10 is limited only by the size of the openings 24 and the length of the side that the openings are on. FIG. 3 shows an example of a part 10A with three openings 24A on two opposing sides 48 and 50 and two openings 24A on the other two opposing sides 44 and 46. This configuration forms a total of ten terminals 52 on component 10A. FIG. 4 shows how these parts 10A would be arranged in a wafer form 28A for mass production.

The number of component sides that may have terminals is not limited to two. Any or all sides of the component may have terminals. For example, see FIGS. 1 and 7 (two sides), FIG. 3 (four sides), and FIG. 5 (three sides).

Figure 5:
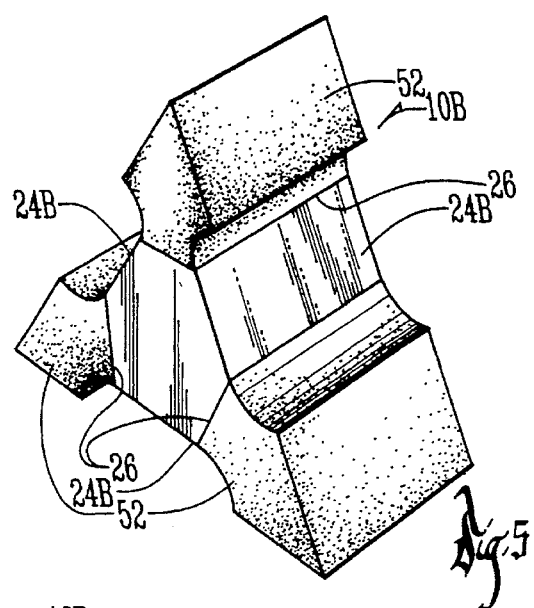
FIG. 5 shows a component with three terminals, one at each corner of a three sided polygon.

Also, the shape of the part 10 does not have to be rectangular. The shape can take the form of a square, a triangle, a circle or oval, or any other shape. FIG. 5 shows an example of a triangular part 10B with three sides having terminals. FIG. 6 shows an example of how the part 10B shown in FIG. 5 could be arranged in wafer form 28B for mass production.

Figure 7:
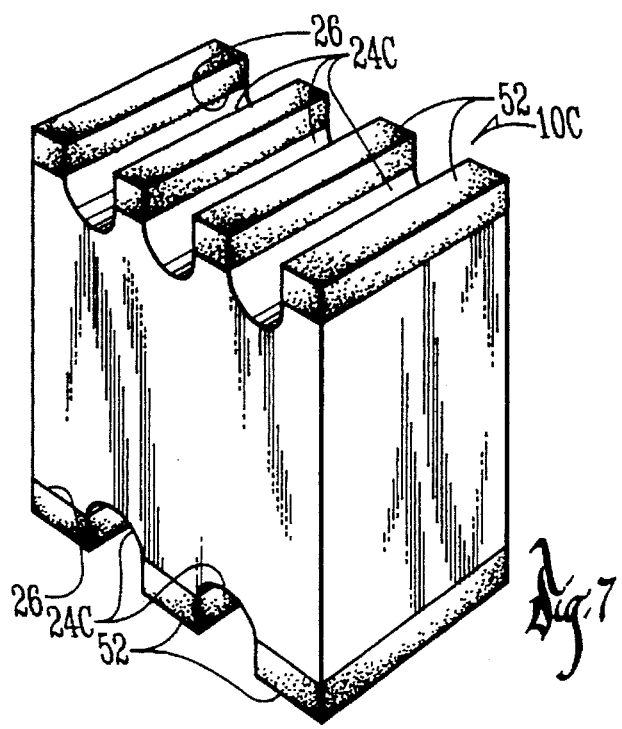
FIG. 7 shows a component with three terminals on one side and four terminals on the opposing side.

FIG. 7 shows the preferred form of the present invention which consists of a rectangular shaped part 10C having oval openings 24C in the thick film material. The part has three terminals on one side while the opposing side has four terminals. As can be seen in FIG. 7, this requires forming three ovals 24C on the side with four terminals and two ovals 24C on the side with three terminals. FIG. 8 shows how the part 10C in FIG. 7 could be arranged in a wafer form 28C for mass production.

Having a rectangular shaped part allows for coating of the terminals on the ends of the part using standard existing technology. This is accomplished by vibrating the parts into openings in a fixture which holds the parts at a uniform depth. The fixture holding the parts is then lowered into the thick film silver ink 26 until the ends of the parts, containing the terminals are dipped into the silver ink 26 to the desired depth D. The ink 26 is then dried and the parts are pressed part way through the fixture to allow the dipping of the other side of the part. Oval shaped openings allow for wider terminals than circular shaped openings would allow. While it would work equally as well to use a rectangular shaped opening, the rounded ends of the oval are easier to print than the sharp corners of a rectangle.

The present invention provides a simple, efficient and reliable method of production of multiple terminal monolithic chip components. The preferred embodiment of the present invention has been set forth in the drawings and specification, and although specific terms are employed, these are used in a generic or descriptive sense only and not used for purposes of limitation. Changes in the form and proportion of parts as well as the substitution of equivalence are contemplated as circumstances may suggest or render expedient without departing from the spirit and scope of the invention as further defined in the following claims.

What is claimed is:

1. A method of making a monolithic electronic component having multiple terminals without drilling through the component comprising the steps of:

printing a plurality of components in a wafer form using a thick film printing technique wherein said components are formed proximate each other forming a matrix of components, said components having at least one terminal end with at least two terminals;

printing said plurality of components with a void formed in said wafer proximate a point where a first terminal end on one component meets a second terminal end on another component, thereby defining an aperture, said aperture being partially defined by the shape of said first terminal end and partially defined by the shape of said second terminal end wherein said aperture separates said terminals on each of said components; and cutting said wafer into a plurality of components intersecting said aperture.

2. A method of creating multiple terminals on monolithic chip components comprising the steps of:

constructing a wafer using a thick film printing technique, said wafer comprising a plurality of monolithic electronic components, said components each having at least one terminal end, said components formed proximate each other forming a matrix of parts wherein said terminal ends of at least two adjacent parts are proximate each other;

forming at least one hole in said wafer while said wafer is being printed by printing said components using a printing pattern which causes said hole to be formed in said wafer, said hole being proximate two adjacent components at a point where the terminal ends of the two adjacent components meet, thereby forming a separation on said terminal end of both of said adjacent components; and separating said wafer into said plurality of monolithic electronic components.

3. The method of claim 1 further comprising the step of coating said terminal end of at least one of said components with a conductive solution whereby said conductive solution makes electrical contact with said terminal end.

4. The method of claim 1 wherein said hole is generally round in shape.

5. The method of claim 1 wherein said hole is generally oval in shape.

6. The method of claim 1 wherein said hole is generally rectangular in shape.

7. The method of claim 1 wherein said component has two terminal ends.

8. The method of claim 1 wherein said component has three terminal ends.

9. The method of claim 1 wherein said component has four terminal ends.

10. The method of claim 1 wherein at least one terminal end of said component has three terminals.

11. The method of claim 1 wherein at least one terminal end of said component has four terminals.

12. A method of making a monolithic electronic component having multiple terminals comprising the steps of:

printing a plurality of components in a wafer form using a thick film printing technique wherein said components are formed proximate each other forming a matrix of components, said components having at least one terminal end with at least two terminals;

forming a hole in said wafer while printing said plurality of components, said hole being formed proximate a point where a first terminal end on one component meets a second terminal end on another component, thereby defining an aperture, said aperture being partially defined by said first terminal end and partially defined by said second terminal end wherein said aperture separates said terminals on each of said components; and cutting said wafer into a plurality of components intersecting said aperture.

13. The method of claim 12 further comprising the step of dipping said terminal end into a conductive solution whereby said partial aperture prevents said conducting solution from providing an electrical short between two terminals.

\* \* \* \* \*